(12) United States Patent
Zheng et al.

(10) Patent No.: US 11,988,726 B2
(45) Date of Patent: May 21, 2024

(54) CURRENT SENSOR

(71) Applicant: Alps Alpine Co., Ltd., Tokyo (JP)

(72) Inventors: Cheng Zheng, Jiangsu (CN); Xunyu Zhang, Jiangsu (CN)

(73) Assignee: ALPS ALPINE CO., LTD., Tokyo (JP)

( * ) Notice: Subject to any disclaimer, the term of this patent is extended or adjusted under 35 U.S.C. 154(b) by 178 days.

(21) Appl. No.: 17/846,464

(22) Filed: Jun. 22, 2022

(65) Prior Publication Data

US 2022/0326318 A1 Oct. 13, 2022

Related U.S. Application Data

(63) Continuation of application No. PCT/CN2020/132626, filed on Nov. 30, 2020.

(30) Foreign Application Priority Data

Dec. 25, 2019 (CN) .......................... 201911354406.9

(51) Int. Cl.
*G01R 19/00* (2006.01)
*G01R 33/02* (2006.01)

(52) U.S. Cl.
CPC ..... *G01R 33/0206* (2013.01); *G01R 19/0092* (2013.01)

(58) Field of Classification Search
CPC ............ G01R 33/0206; G01R 33/0076; G01R 15/207; H02M 1/0009
See application file for complete search history.

(56) References Cited

U.S. PATENT DOCUMENTS

| 8,638,541 | B2 | 1/2014 | Mizushima |
| 9,983,074 | B2 | 5/2018 | Minami et al. |
| 10,877,075 | B2 * | 12/2020 | Okuyama ............ G01R 15/205 |
| 10,962,573 | B2 * | 3/2021 | Nomura ................ H01L 23/552 |

(Continued)

FOREIGN PATENT DOCUMENTS

| JP | 5357100 | 12/2013 |
| WO | WO 2011/096093 | 8/2011 |
| WO | WO 2015/199228 | 12/2015 |

OTHER PUBLICATIONS

International Search Report from corresponding International Application No. PCT/JP2020/04846, dated Mar. 21, 2021, 5 pp.

*Primary Examiner* — Dominic E Hawkins
(74) *Attorney, Agent, or Firm* — Crowell & Moring LLP (57) ABSTRACT

A current sensor includes: plate-shaped bus bars; a magnetic detection portion; and a shell holding the bus bars. The bus bars are arranged in a first direction. At least some of the bus bars have: a first conductor portion extending in the first direction; a second conductor portion connected to one end of the first conductor portion and extending in a second direction crossing the first direction; and a third conductor portion connected to the other end of the first conductor portion and extending in a third direction. The bus bars at least include first and second bus bars adjacent in the first direction, where the width of the first conductor portion is greater than the thickness thereof, and when viewed from the third direction, the first conductor portions of the first and second bus bars are spaced apart from each other by a certain distance in the second direction.

7 Claims, 7 Drawing Sheets

(56) References Cited

U.S. PATENT DOCUMENTS

| | | | |
|---|---|---|---|
| 2015/0355241 A1* | 12/2015 | Kawanami | G01R 15/20 |
| | | | 324/117 R |
| 2019/0018046 A1* | 1/2019 | Shimizu | G01R 31/382 |
| 2019/0234996 A1* | 8/2019 | Nomura | H01L 23/053 |
| 2020/0300895 A1* | 9/2020 | Tamura | G01R 3/00 |
| 2022/0214382 A1* | 7/2022 | Wolf | G01R 19/0092 |

* cited by examiner

CURRENT SENSOR

CLAIM OF PRIORITY

This application is a Continuation of International Application No. PCT/CN2020/132626 filed on Nov. 30, 2020, which claims benefit of priority to Chinese Patent Application No. 201911354406.9 filed on Dec. 25, 2019. The entire contents of each application noted above are hereby incorporated by reference.

BACKGROUND

1. Field of the Disclosure

The present disclosure relates to a current sensor that detects current flowing through a plurality of bus bars of an inverter.

2. Description of the Related Art

As one of the main components of the driving portion of an electric vehicle, the inverter is used to control the main motor of the vehicle to provide power for the vehicle. In order to extend the endurance mileage of the existing electric vehicle, it is desired to store more electric energy in a limited space and weight. Therefore, it is urgent to improve the energy density of batteries and inverters to further achieve miniaturization and light weight.

In addition, the current design uses a plurality of bus bars to connect the inverter and the motor. Since there is a need to detect the output of the inverter, a current sensor is configured to detect the current flowing in each bus bar. Such a current sensor includes not only a plurality of bus bars, but also a detection portion that detects the current flowing in each of the bus bars.

In pursuit of miniaturization and light weight of the driving portion of the electric vehicle, there is a development trend of integrating the inverter and the motor. Therefore, the size of the current sensor for connecting the inverter and the motor should be designed to be smaller.

The bus bar is usually composed of a long-strip metal plate. When a plurality of bus bars are arranged in the current sensor along one direction, two ends of each bus bar are exposed to the outside of the current sensor, the connection portion of the central end of each bus bar is located inside the current sensor, and the surfaces of the metal plates of the connection portions are configured in the current sensor so that they are parallel to each other and face the same direction.

In order to miniaturize the current sensor, it is considered to reduce the pitch between the respective connection portions that are parallel to each other as much as possible. However, when the number of the bus bars to be arranged increases, the lengths of the connection portions become longer, and the longer connection portions may be deflected by the filling pressure of liquid resin during insert molding. Therefore, the connection portions of the respective bus bars may contact each other to cause the danger of short circuit.

As one of the methods for preventing the bus bars from contacting each other to cause short circuit, it is conceivable that the above-mentioned connection portions are sequentially staggered in a direction orthogonal to the arrangement direction of the plurality of bus bars without overlapping at least a part, and positioning pins are provided in a mold for insert molding to press the connection portions of the bus bars during molding. In such a way, the size of the current sensor in the direction orthogonal to the arrangement direction will increase, and the mold for insert molding becomes complicated and more difficult to process.

SUMMARY

The present invention is achieved in view of such problems, and provides a current sensor capable of suppressing short circuit between bus bars.

A current sensor includes: a plurality of plate-shaped bus bars; a magnetic detection portion arranged corresponding to each of the bus bars for detecting a magnetic field formed when current is flowing in each of the bus bars; and a shell that holds the plurality of bus bars integrally with the plurality of bus bars. The current sensor is characterized in that the plurality of bus bars are arranged in a first direction, and at least some of the plurality of bus bars include: a first conductor portion extending in the first direction; a second conductor portion connected to one end of the first conductor portion and extending in a second direction crossing the first direction; and a third conductor portion connected to the other end of the first conductor portion and extending in a third direction crossing both the first direction and the second direction. A dimension of the first conductor portion extending in the first direction is a length of the first conductor portion. A dimension of the first conductor portion in the second direction is a width of the first conductor portion. A dimension of the first conductor portion in the third direction is a thickness of the first conductor portion. The at least some of the bus bars include a first bus bar and a second bus bar in which the width of the first conductor portion is greater than the thickness of the first conductor portion and which are adjacent in the first direction, and when viewed from the third direction. The first conductor portion of the first bus bar and the first conductor portion of the second bus bar are spaced apart from each other by a certain distance in the second direction.

When the bus bars are formed in the shell by insert molding, since the second conductor portions and the third conductor portions are respectively close to two sides of the third direction, the bus bars can be easily held by a mold not shown during the insert molding, and are unlikely to be deflected by the filling pressure of flowing resin. However, the first conductor portions located at the center in the third direction are usually not held by the mold, or only some of the first conductor portions can be held by the mold. In this state, for the bus bars in which the width of the first conductor portion is greater than the thickness thereof, the two surfaces of the first conductor portions that face the third direction respectively have relatively large area, and the two surfaces are easily deflected in the third direction based on the filling pressure of resin.

According to such a current sensor, the two adjacent first conductor portions of the bus bars do not overlap in the second direction and are spaced apart from each other by a certain distance, so that the insulation distance of the two adjacent first conductor portions in the third direction is long enough, and even if a certain first conductor portion is deflected in the third direction, the first conductor portions can be suppressed from swinging in the third direction to cause short circuit. Moreover, since the enough insulation distance is ensured by the above structure, the number of positioning pins arranged in the mold for insert molding can be reduced, and the processing difficulty of the mold can be reduced.

DESCRIPTION OF THE EXEMPLARY EMBODIMENTS

A first embodiment of a current sensor of the present invention, the overall structure of the current sensor 100 will be described with reference to FIGS. 1 to 3.

In the drawings, the arrangement and configuration of each part will be described using the X-axis, the Y-axis, and the Z-axis which are orthogonal to each other. The X1-X2 direction is the length direction of the current sensor, the Y1-Y2 direction is the width direction of the current sensor, and the Z1-Z2 direction is the height direction of the current sensor.

Figure 1:
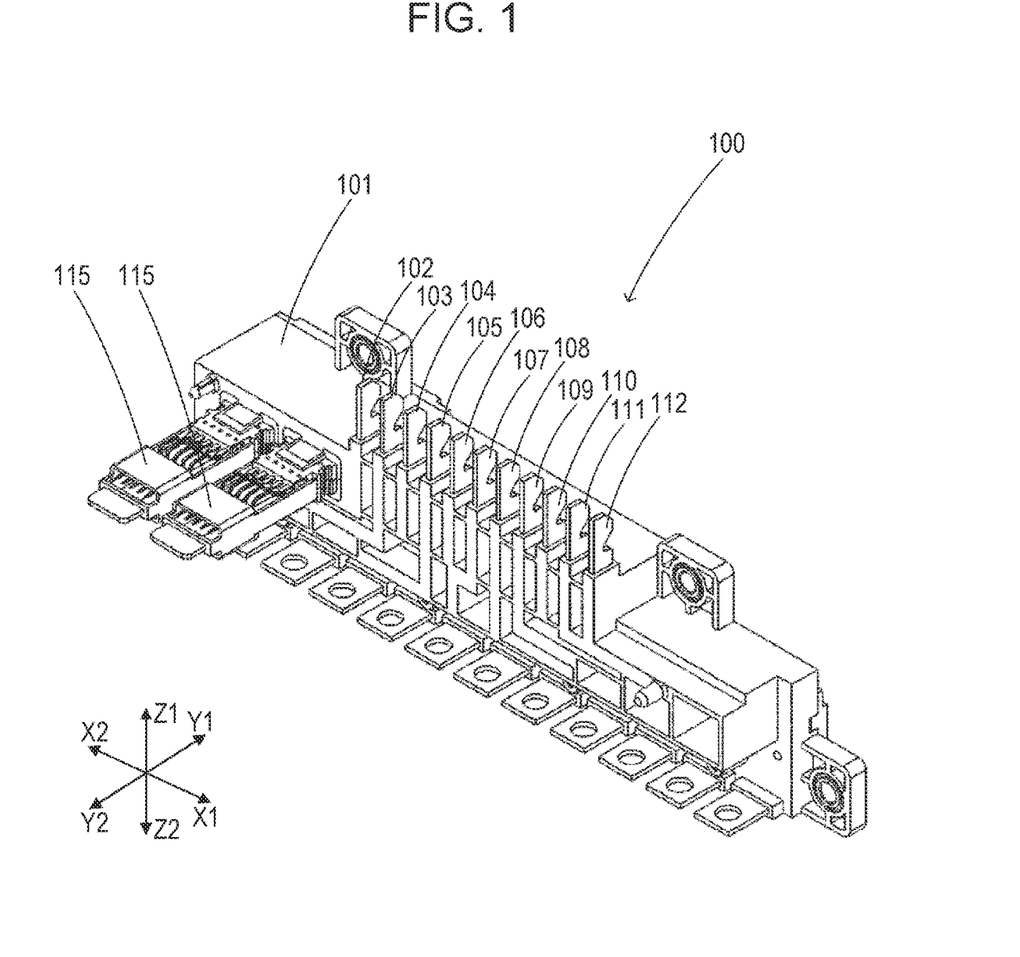
FIG. 1 is a three-dimensional diagram of a current sensor according to a first embodiment.

FIG. 1 is a three-dimensional diagram of a current sensor 100 according to a first embodiment. FIG. 2 is an exploded three-dimensional diagram of the current sensor 100 according to the first embodiment. FIG. 3 is an exploded three-dimensional diagram of a shell 101 and bus bars 102 to 112 in the current sensor 100.

Figure 2:
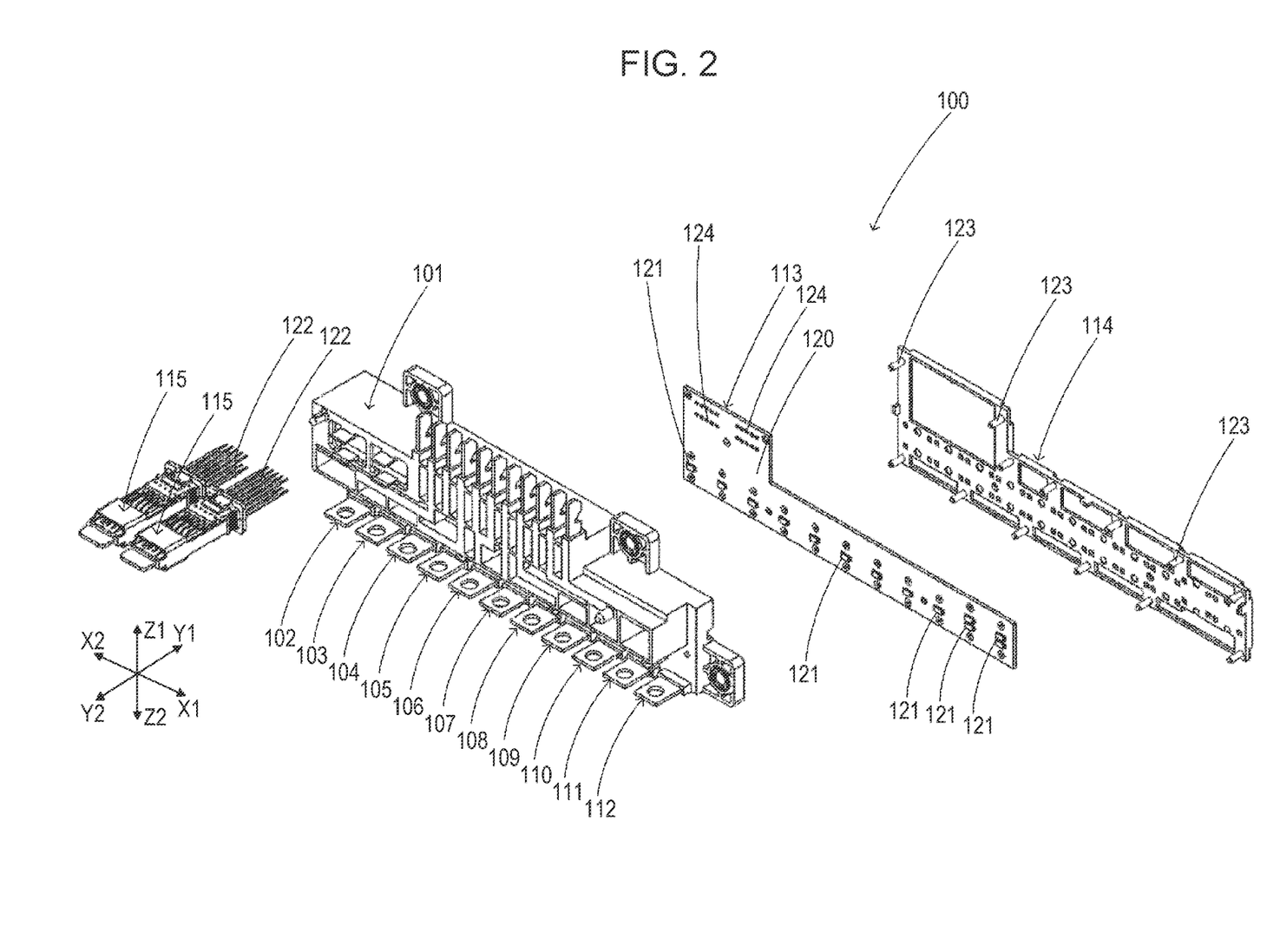
FIG. 2 is an exploded three-dimensional diagram of the current sensor according to the first embodiment.

As shown in FIGS. 1 and 2, the current sensor 100 has a substantially rectangular parallelepiped shape, and includes a shell 101, a plurality of bus bars 102 to 112, a current detection member 113, a cover 114, and two output members 115.

As shown in FIG. 2, the shell 101 is integrally formed with the plurality of bus bars 102 to 112 by insert molding, and holds the plurality of bus bars 102 to 112. The shell 101 is made of synthetic resin, and the plurality of bus bars 102 to 112 are made of long-strip metal plates. In addition, the plurality of bus bars 102 to 112 are independent of each other (see FIG. 3), and are sequentially arranged in the length direction (X1-X2 direction) of the current sensor 101. The specific structure of each of the bus bars 102 to 112 will be described later.

As shown in FIG. 2, the current detection member 113 includes a circuit board body 120 and detection elements 121. The circuit board body 120 is constituted by a printed circuit board (PCB). The plurality of detection elements 121 are arranged on the circuit board body 120 at a distance in the X1-X2 direction. The plurality of detection elements 121 serving as magnetic detection portions are arranged corresponding to the bus bars 102 to 112 for detecting the magnetic field formed when current is flowing in each of the bus bars 102 to 112, thereby detecting the magnitude of the current.

According to different characteristics of the current flowing in each bus bar, as shown in FIG. 2, one detection element 121 corresponds to the bus bars 102 to 110 respectively, and two detection elements 121 correspond to the bus bars 111 and 112 respectively.

Further, the cover 114 is made of synthetic resin. Although not shown in the drawings, the shell 101 and the cover 114 are respectively built with magnetic shielding members at positions corresponding to the detection elements 121, and each magnetic shielding member is formed in a square thin plate shape from a material capable of magnetic shielding such as silicon steel.

In addition, each output member 115 has ten metal output terminals 122 for outputting current values detected by the respective detection elements 121 to an inverter (not shown).

In the state shown in FIG. 1, the shell 101, the current detection member 113, and the cover 114 are assembled together by a plurality of screws 123 (refer to FIG. 2). At this time, the output terminals 115 are assembled in the shell 101, and the plurality of output terminals 122 are respectively inserted into a plurality of metal holes 124 on the circuit board body 120. The plurality of metal holes 124 are electrically connected to the plurality of detection elements 121 via wires not shown, respectively.

Next, the structures of the bus bars 102 to 112 in the current sensor 100 will be described in detail with reference to FIGS. 3 to 6.

Figure 3:
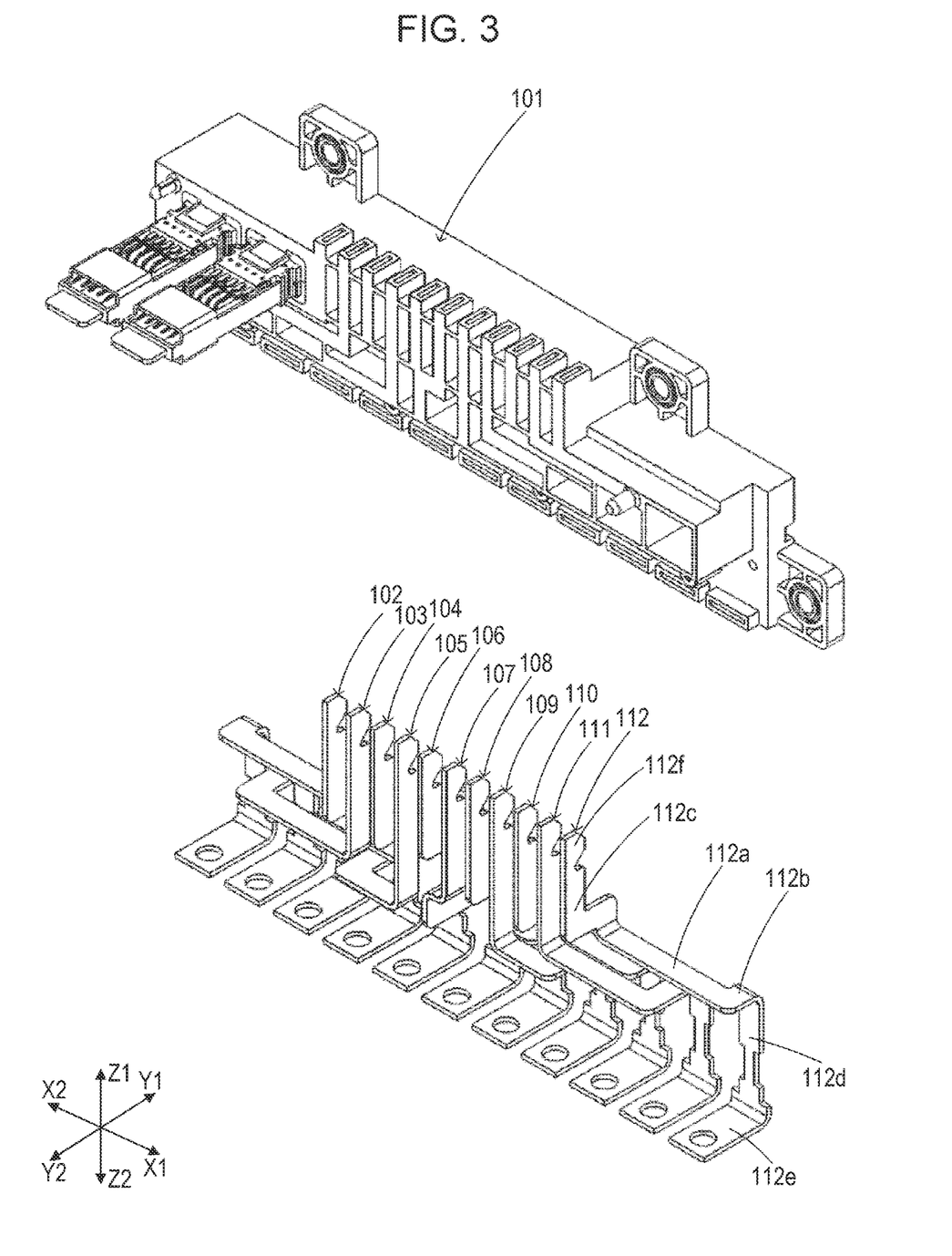
FIG. 3 is an exploded three-dimensional diagram of a shell and bus bars in the current sensor.

First, the general structures of the bus bars 102 to 112 are described, taking the bus bar 112 located at one end of X1 in FIG. 3 as an example.

The bus bar 112 has at least: a first conductor portion 112a extending in the X1-X2 direction; a second conductor portion 112b connected to one end (the end on the X1 side) of the first conductor portion 112a and extending in the Y1-Y2 direction; and a third conductor portion 112c connected to the other end of the first conductor portion 112a (the end on the X2 side) and extending in the Z1-Z2 direction.

In addition, the bus bar 112 further has a fourth conductor portion 112d connected to the second conductor portion 112b and extending in the Z1-Z2 direction, and a first connection terminal portion 112e connected to the fourth conductor portion 112d and extending in the Y1-Y2 direction.

The first connection terminal portion 112e is used for connection with an inverter (first external component) of an electric vehicle that is not shown. The electrical connection between the first connection terminal portion 112e and the inverter may be, for example, bolt connection.

Further, the third conductor portion 112c has a second connection terminal portion 112f connected to a motor (second external component) of the electric vehicle. The electrical connection between the second connection terminal portion 112f and the motor is, for example, welding.

Further, as shown in FIG. 3, each of the bus bars 102 to 112 is in a plate shape. For the convenience of description, the dimensions of the first conductor portions 102a to 112a of the bus bars 102 to 112 extending in the X1-X2 direction are the lengths of the first conductor portions 102a to 112a, the dimensions of the first conductor portions 102a to 112a in the Y1-Y2 direction are the widths of the first conductor portions 102a to 112a, and the dimensions of the first conductor portions 102a to 112a in the Z1-Z2 direction are the thicknesses of the first conductor portions 102a to 112a.

Figure 4:
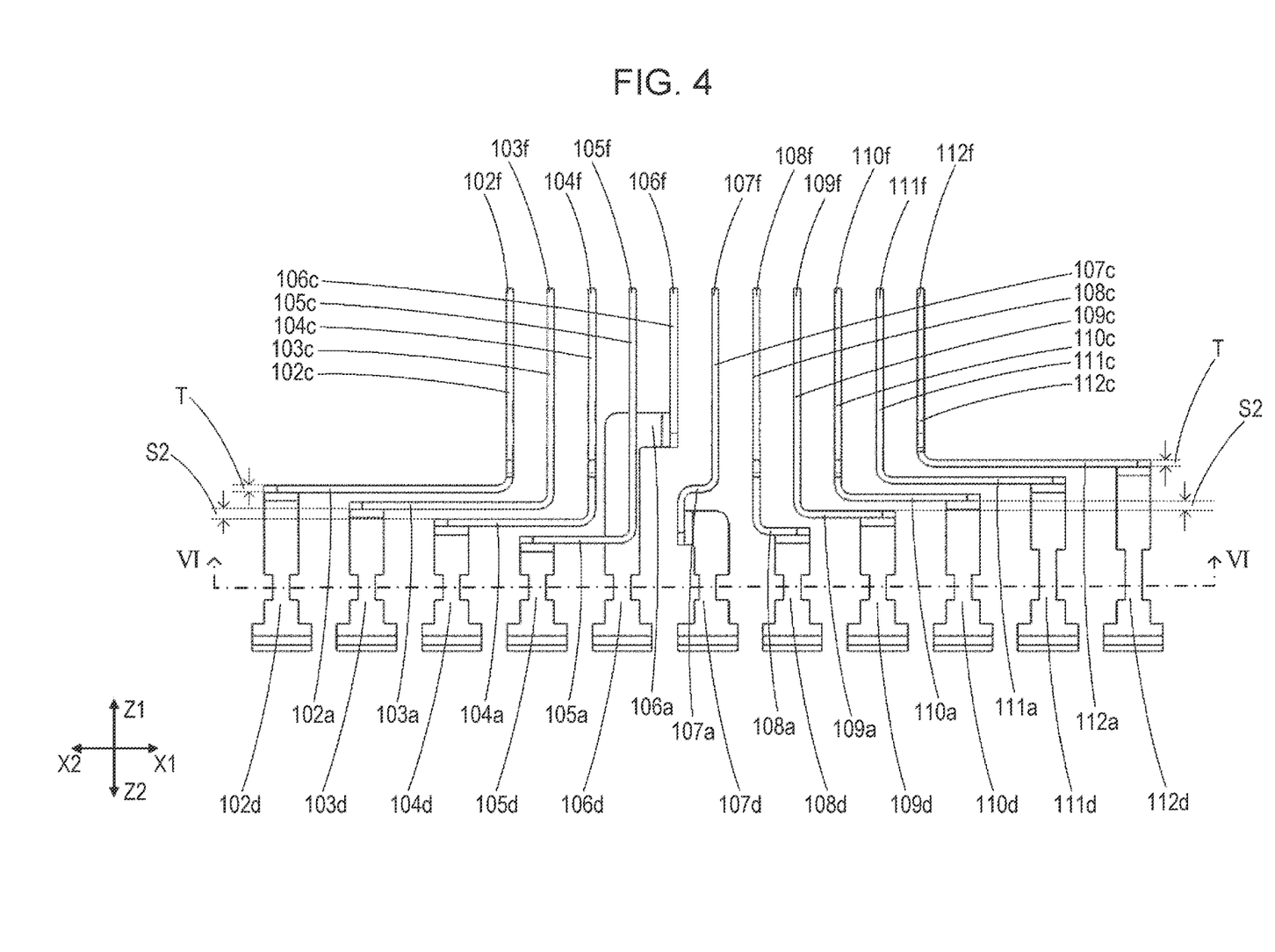
FIG. 4 is a front view of the bus bars in the current sensor.
Figure 5:
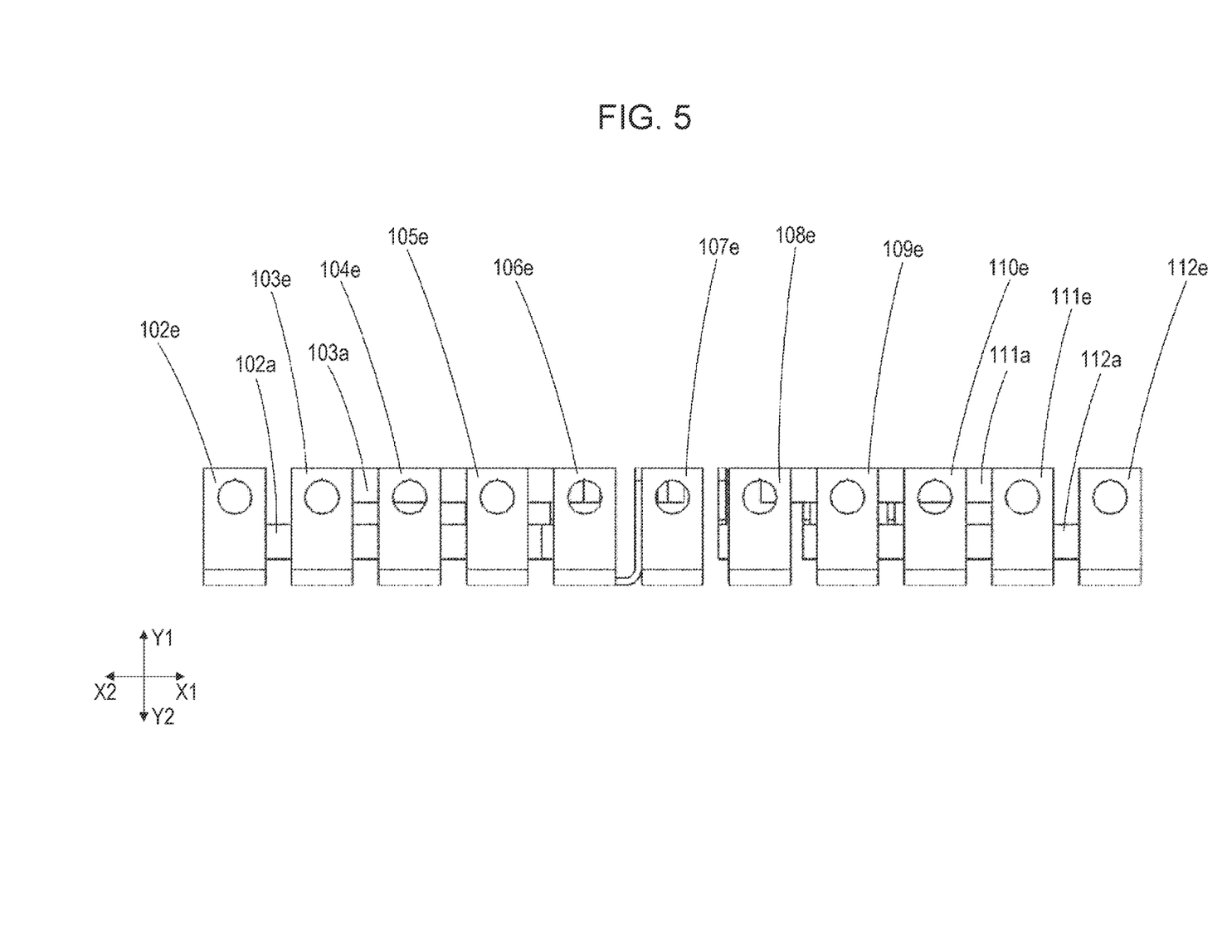
FIG. 5 is a bottom view of the bus bars in the current sensor.
Figure 6:
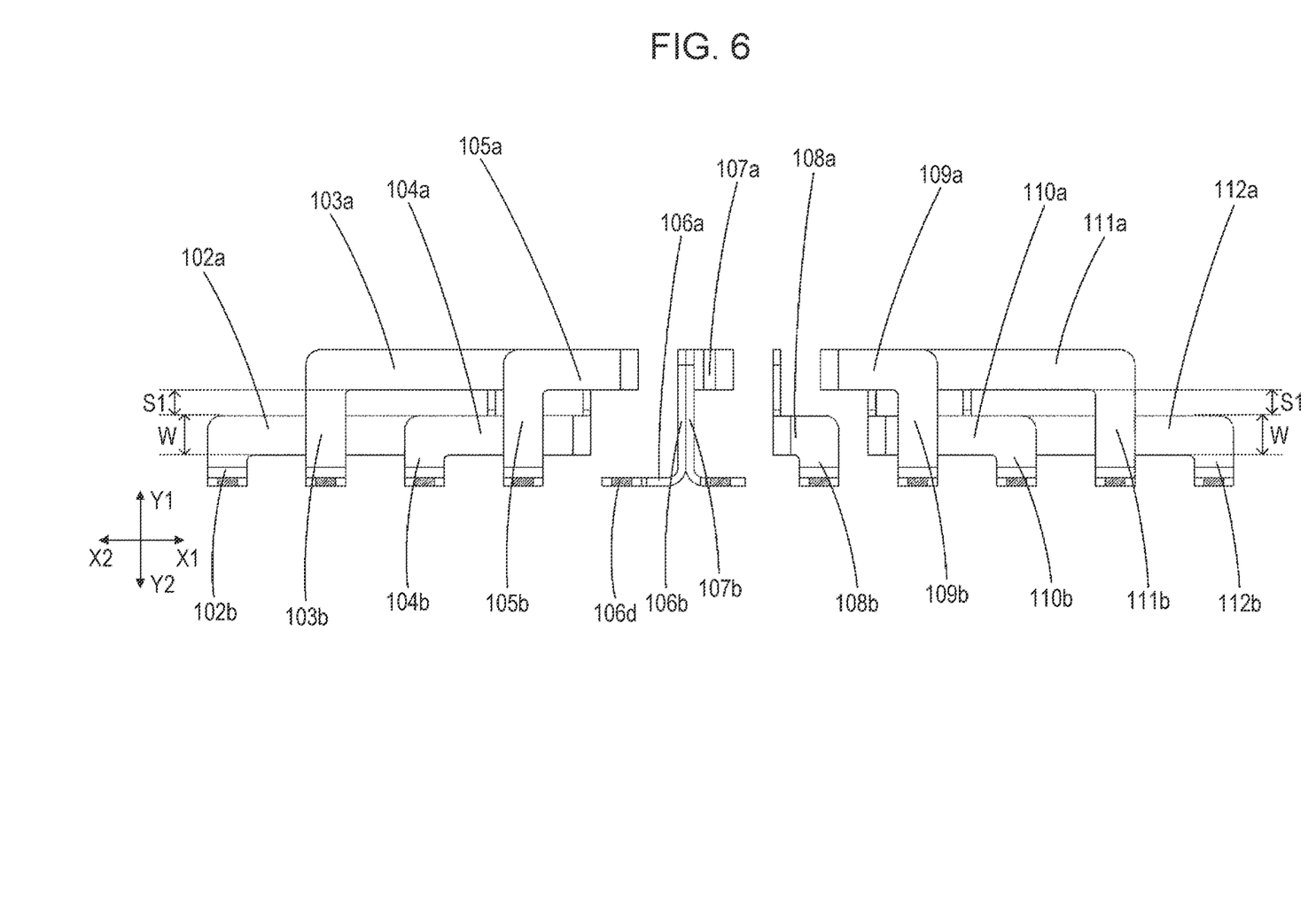
FIG. 6 is a cross-sectional view taken along line VI-VII in FIG. 4.

FIG. 4 is a front view of the bus bars 102 to 112 in the current sensor 100. FIG. 5 is a bottom view of the bus bars 102 to 112 in the current sensor 100. FIG. 6 is a cross-sectional view taken along line VI-VII in FIG. 4. Since parts of the first connection terminal portions 102e to 112e of the respective bus bars 102 to 112 are not shown in FIG. 6, the shapes of the respective first conductor portions 102a to 112a can be seen more clearly than in FIG. 5.

The shapes of the plurality of bus bars 102 to 112 are different from each other. As shown in FIGS. 4 and 6, the widths W (refer to FIG. 6) of the first conductor portions 102a to 105a and 109a to 112a of the bus bars 102 to 105 and 109 to 112 are greater than the thicknesses T (refer to FIG. 4) thereof, and the widths W of the first conductor portions 106a and 107a of the bus bars 106 and 107 are smaller than the thicknesses T thereof. That is, the plurality of bus bars 102 to 112 at least include the bus bars 102 to 105 which have the widths W greater than the thicknesses T and are adjacent in the X1-X2 direction, and the bus bars 109 to 112 which have the widths W greater than the thicknesses T and are adjacent in the X1-X2 direction.

Furthermore, in the case where two adjacent bus bars in the X1-X2 direction among the bus bars 102 to 105 and 109 to 112 are divided into a first bus bar and a second bus bar, when viewed from the Z1-Z2 direction, as shown in FIG. 6, the first conductor portion of the first bus bar and the first conductor portion of the second bus bar are spaced apart from each other by a certain distance in the Y1-Y2 direction.

Specifically, the first conductor portion 102a of the bus bar 102 and the first conductor portion 103a of the bus bar 103 are spaced apart from each other by a certain distance in the Y1-Y2 direction, the first conductor portion 103a of the bus bar 103 and the first conductor portion 104a of the bus bar 104 are spaced apart from each other by a certain distance in the Y1-Y2 direction, the first conductor portions 104a of the bus bar 104 and the first conductor portion 105a of the bus bar 105 are spaced apart from each other by a certain distance in the Y1-Y2 direction, the first conductor portion 109a of the bus bar 109 and the first conductor portion 110a of the bus bar 110 are spaced apart from each other by a certain distance in the Y1-Y2 direction, the first conductor portion 110a of the bus bar 110 and the first conductor portion 111a of the bus bar 111 are spaced apart from each other by a certain distance in the Y1-Y2 direction, and the first conductor portion 111a of the bus bar 111 and the first conductor portion 112a of the bus bar 112 are spaced apart from each other by a certain distance in the Y1-Y2 direction.

In addition, when any one of the bus bars 102 to 105 and 109 to 112 in which the width W of the first conductor portion is greater than the thickness T thereof is used as a reference bus bar, and the other bus bars arranged on both sides in the X1-X2 direction with respect to the reference bus bar are used as comparison bus bars, the first conductor portions of two comparison bus bars are arranged on the same side in the Y1-Y2 direction with respect to the first conductor portion of the reference bus bar.

For example, in FIG. 6, when the bus bar 103 is used as a reference bus bar and the bus bar 102 and the bus bar 104 are used as comparison bus bars, the first conductor portion 102a of the bus bar 102 and the first conductor portion 104a of the bus bar 104 are arranged on the same side in the Y1-Y2 direction with respect to the first conductor portion 103a of the bus bar 103. That is, both the first conductor portion 102a and the first conductor portion 104a are arranged on the Y2 direction side of the first conductor portion 103a.

In other words, although the first conductor portion 102a of the bus bar 102 and the first conductor portion 104a of the bus bar 104 are respectively arranged on both sides of the first conductor portion 103a of the bus bar 103 (the X2 direction side and the X1 direction side) in the X1-X2 direction, the first conductor portion 102a of the bus bar 102 and the first conductor portion 104a of the bus bar 104 are not respectively arranged on both sides of the first conductor portion 103a of the bus bar 103 (the Y1 direction side and the Y2 direction side) in the Y1-Y2 direction, but arranged on the same side (the Y2 direction side).

Further, in this embodiment, the distances between the first conductor portions of the two comparison bus bars and the first conductor portion of the reference bus bar are the same in the Y1-Y2 direction. For example, as shown in FIG. 6, the distance between the first conductor portion 102a of the bus bar 102 and the first conductor portion 103a of the bus bar 103 is the pitch S1 in the Y1-Y2 direction. Also, the distances between the bus bars 102, 104, 110, and 112 and the bus bars 103, 105, 109, and 111 are all the pitch S1 in the Y1-Y2 direction.

In addition, in the case where two adjacent bus bars in the X1-X2 direction among the bus bars 102 to 105 and 109 to 112 are divided into the first bus bar and the second bus bar as described above, as shown in FIG. 4, when viewed from the Y1-Y2 direction, the first conductor portion of the first bus bar and the first conductor portion of the second bus bar are spaced apart from each other by a certain distance in the Z1-Z2 direction. In this embodiment, for any two adjacent bus bars in the X1-X2 direction among the bus bars 102 to 105 and 109 to 112, the distance between the two first conductor portions in the Z1-Z2 direction is the pitch S2.

In addition, as shown in FIG. 6, when viewed from the Z1-Z2 direction, although the first conductor portions (e.g., the first conductor portion 102a) of some bus bars may overlap the second conductor portions (e.g., the second conductor portion 103b) of the adjacent bus bars, because the extension lengths (spans) of the second conductor portions in the Y1-Y2 direction are small, deflection due to the filling pressure of resin is unlikely to occur during insert molding.

Moreover, since the bus bar 106, the bus bar 107, and the bus bar 108 are located in the center of the X1-X2 direction, the shapes of the first conductor portions 106a to 108a and the second conductor portions 106b to 108b are different from those of other bus bars.

The first conductor portion 106a of the bus bar 106 is formed such that its dimension in the thickness direction (Z1-Z2 direction) (refer to FIG. 4) is greater than its dimension in the width direction (Y1-Y2 direction) (refer to FIG. 6). Furthermore, as shown in FIGS. 4 and 6, one end of the first conductor portion 106a of the bus bar 106 is connected to the fourth conductor portion 106d, the other end of the first conductor portion 106a is connected to the second conductor portion 106b, and the second conductor portion 106b is further connected to the third conductor portion 106c.

In addition, the first conductor portion 107a of the bus bar 107 and the first conductor portion 108a of the bus bar 108 are formed such that their dimensions in the width direction (refer to FIG. 6) are greater than their dimensions in the thickness direction (refer to FIG. 4), but their distances extending in the X1-X2 direction are relatively short. The bus bars such as the bus bar 106, the bus bar 107, and the bus bar 108 are unlikely to be deflected by the filling pressure of resin during insert molding.

Next, the technical effects of the first embodiment will be described.

When the bus bars 102 to 112 are formed in the shell 101 by insert molding, since the second conductor portions 102b to 112b and the third conductor portions 102b to 112b are respectively close to the Z1 direction side and the Z2 direction side, the bus bars 102 to 112 can be easily held by a mold not shown during the insert molding, and are unlikely to be deflected by the filling pressure of flowing resin. However, the first conductor portions 102a to 112a located at the center in the Z1-Z2 direction are usually not held by the mold, or only some of the first conductor portions 102a to 112a can be held by the mold. In this state, for the bus bars 102 to 105 and 109 to 112 in which the width W of the first conductor portion is greater than the thickness T thereof, the two surfaces of the first conductor portions 102a to 105a and 109a to 112a that face the Z1 direction and the Z2 direction respectively (that is, the two surfaces parallel to the paper surface in FIG. 6) have relatively large area, and the two surfaces are easily deflected in the Z1-Z2 direction based on the filling pressure of resin.

According to the current sensor 100 of this embodiment, the two adjacent first conductor portions of the bus bars 102 to 105 and 109 to 112 do not overlap in the Y1-Y2 direction and are spaced apart from each other by a certain distance, so that the insulation distance of the two adjacent first conductor portions in the Z1-Z2 direction is long enough, and even if a certain first conductor portion is deflected in the Z1-Z2 direction, the first conductor portions 102a to 105a and 109a to 112a can be suppressed from swinging in the Z1-Z2 direction to cause short circuit. Moreover, since the enough insulation distance is ensured by the above structure, the number of positioning pins arranged in the mold for insert molding can be reduced, and the processing difficulty of the mold can be reduced. In this embodiment, when the reference insulation distance is set to 2 mm, the insulation distance between the two adjacent first conductor portions in the Z1-Z2 direction is about 5 mm.

Furthermore, according to the current sensor 100 of this embodiment, since the first direction is the length direction of the current sensor (i.e., the X1-X2 direction), the first conductor portions 102a to 105a and 109a to 112a of the bus bars 102 to 105 and 109 to 112 extending in the first direction may have a long span (for example, the first conductor portions 102a to 104a and 109a to 112a in this embodiment), and deflection is more likely to occur. The structure of the present invention can ensure that even if the first conductor portions having a long span (for example, the first conductor portions 102a to 104a and 109a to 112a in this embodiment) are deflected, short circuit can also be suppressed.

In addition, if the first conductor portions of the comparison bus bars are respectively arranged on different sides in the second direction, the size of the current sensor 100 in the Y1-Y2 direction will increase as the number of bus bars increases. According to the current sensor 100 of this embodiment, the size of the current sensor 100 in the Y1-Y2 direction can be greatly reduced compared to the case where the first conductor portions of the comparison bus bars are arranged on different sides in the Y1-Y2 direction.

Further, according to the current sensor 100 of this embodiment, compared to the case where the distances between the first conductor portions of two comparison bus bars and the first conductor portion of the reference bus bar are different, as shown in FIG. 6, the case where the distances between the first conductor portions of two comparison bus bars and the first conductor portion of the reference bus bar are the same (pitch S1) can further reduce the size of the current sensor 100 in the Y1-Y2 direction.

In addition, according to the current sensor 100 of this embodiment, for any two adjacent bus bars in the X1-X2 direction among the bus bars 102 to 105 and 109 to 112, as shown in FIG. 4, the two first conductor portions being spaced apart from each other by a certain distance (pitch S2) in the Z1-Z2 direction can further prevent short circuit due to deflection of the first conductor portions 102a to 105a and 109a to 112a in the Y1-Y2 direction.

Modification 1

The above-described first embodiment shows that the first conductor portion of the first bus bar and the first conductor portion of the second bus bar in the two bus bars that are adjacent in the X1-X2 direction are spaced apart from each other by a certain distance when viewed from the Y1-Y2 direction, but the present invention is not limited thereto. Modification 1 shows that the first conductor portion of the first bus bar and the first conductor portion of the second bus bar in the two adjacent bus bars partially overlap. Hereinafter, only the content different from the first embodiment will be described.

Figure 7:
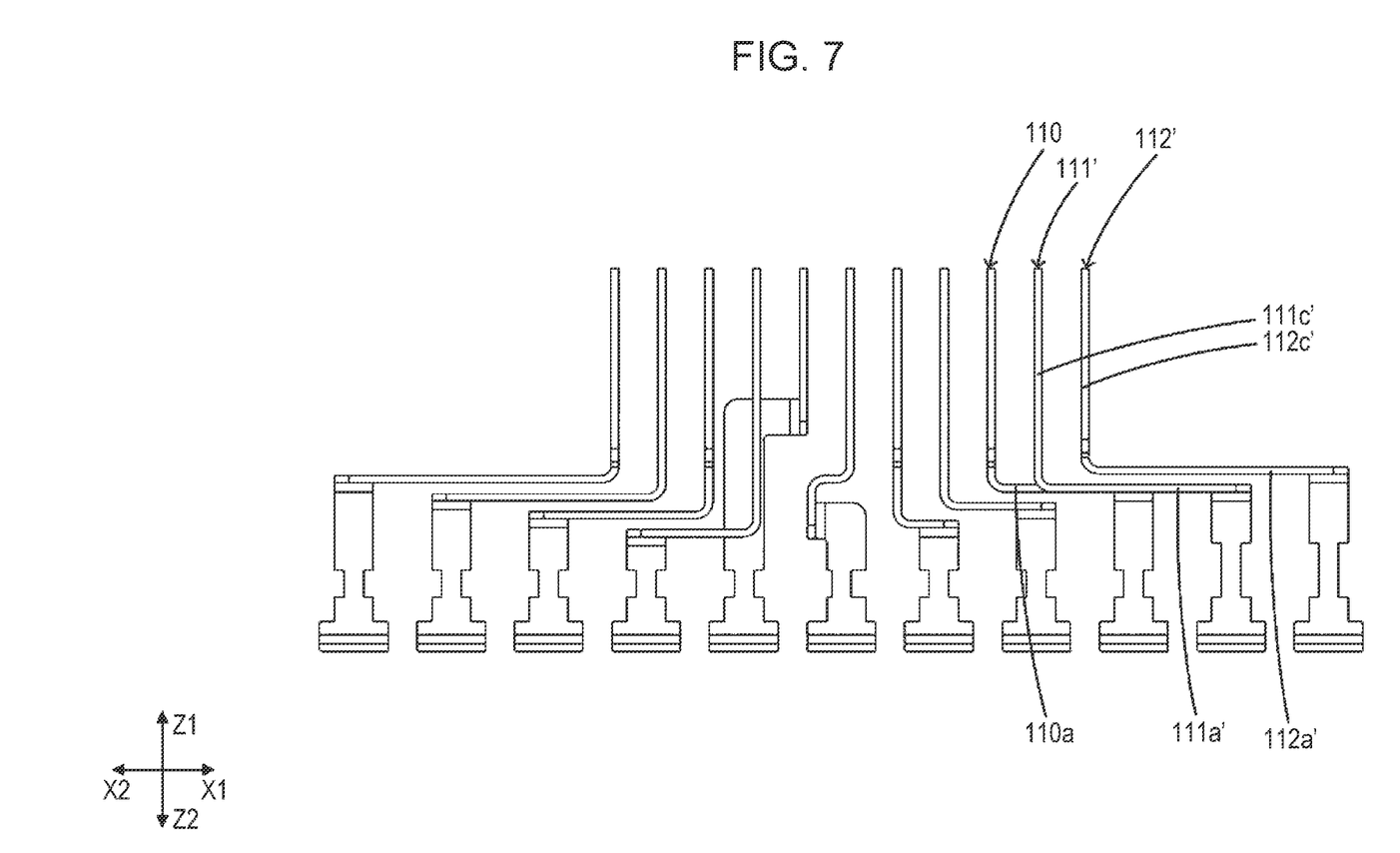
FIG. 7 is a front view of bus bars in the current sensor of Modification 1.

FIG. 7 is a front view of a plurality of bus bars in the current sensor 100 of Modification 1. The arrangement positions of the bus bar 111' and the bus bar 112' in the Z1-Z2 direction in Modification 1 are different from those of the first embodiment.

The first conductor portion 110a of the bus bar 110 and the first conductor portion 111a of the bus bar 111 that are adjacent in the X1-X2 direction are spaced apart from each other by a certain distance in FIG. 4, while the first conductor portion 110a of the bus bar 110 and the first conductor portion 111a' of the bus bar 111' that are adjacent in the X1-X2 direction partially overlap in FIG. 7.

Specifically, a part of the first conductor portion 110a of the bus bar 110 on the side close to the second conductor portion 110b overlaps a part of the first conductor portion 111a' of the bus bar 111' on the side close to the third conductor portion 111c'.

Both the first conductor portion 110a and the first conductor portion 111a' in Modification 1 are formed in a plate shape with a width W greater than a thickness T, so the degree of deflection of the first conductor portion 110a and the first conductor portion 111a' in the Y1-Y2 direction is smaller than that in the Z1-Z2 direction, and short circuit hardly occurs even if the bus bar 110 and the bus bar 111' partially overlap when viewed from the Y1-Y2 direction. Based on such a partially overlapping structure, the size of the current sensor 100 in the Z1-Z2 direction can be further reduced. In other words, the overall size of each bus bar in the Z1-Z2 direction in Modification 1 can be designed to be smaller than the overall size of each bus bar in the Z1-Z2 direction in the first embodiment to a certain extent.

In addition, a part of the first conductor portion 110a of the bus bar 110 and a part of the first conductor portion 111a' of the bus bar 111' that overlap are preferably the parts near the second conductor portion or third conductor portion in the respective first conductor portions. Compared to the part near the center of each first conductor portion, the degrees of deflection of the part near the second conductor portion or third conductor portion of the first conductor portion in the Y1-Y2 direction and the Z1-Z2 direction are smaller, so short circuit hardly occurs in such a part.

Based on the shape of each first conductor portion, the deflection of the first conductor portion in the Z1-Z2 direction is larger toward the center in the X1-X2 direction, and smaller toward both ends in the X1-X2 direction. Therefore, as shown in FIG. 7, the part of the first conductor portion 110a of the bus bar 110 on the side close to the second conductor portion 110b (refer to FIG. 6) is opposed to the part of the first conductor portion 112a' of the bus bar 112' on the side close to the third conductor portion 112c' in the Z1-Z2 direction, but since the opposed parts are the parts of the respective first conductor portions having a small degree of deflection, short circuit also hardly occurs between the bus bar 110 and the bus bar 112'.

ADDITIONAL MODIFICATIONS

The above-described first embodiment is only a preferred example, and the present invention is not limited thereto. For example, with respect to the above-described first embodiment, those skilled in the art can appropriately add, delete, and change the design of components, and appropriately combine the features of respective embodiments, as long as the technical idea of the present invention is provided, all of the modifications are included in the scope of the present invention.

The shape of each of the bus bars 102 to 112 in the first embodiment is merely an example, and can be appropriately changed according to the arrangement position and function of each bus bar.

In addition, the above-described first embodiment shows that the distances (pitch S1) in the Y1-Y2 direction between the first conductor portions of two comparison bus bars and the first conductor portion of the reference bus bar are the same, but the distances in the Y1-Y2 direction between the first conductor portions of two comparison bus bars and the first conductor portion of the reference bus bar may also be different.

What is claimed is:

1. A current sensor, comprising: a plurality of plate-shaped bus bars; a magnetic detection portion arranged corresponding to each of the bus bars that detects a magnetic field formed when current is flowing in each of the bus bars; and a shell that holds the plurality of bus bars integrally with the plurality of bus bars, wherein:
    the plurality of bus bars are arranged in a first direction,
    at least some of the plurality of bus bars comprise: a first conductor portion extending in the first direction; a second conductor portion connected to one end of the first conductor portion and extending in a second direction crossing the first direction; and a third conductor portion connected to the other end of the first conductor portion and extending in a third direction crossing both the first direction and the second direction,
    a dimension of the first conductor portion extending in the first direction is a length of the first conductor portion, a dimension of the first conductor portion in the second direction is a width of the first conductor portion, and a dimension of the first conductor portion in the third direction is a thickness of the first conductor portion,
    the at least some of the bus bars comprise a first bus bar and a second bus bar in which the width of the first conductor portion is greater than the thickness of the first conductor portion and which are adjacent in the first direction, when viewed from the third direction, the first conductor portion of the first bus bar and the first conductor portion of the second bus bar are spaced apart from each other by a certain distance in the second direction, and when viewed from the second direction, the first conductor portion of the first bus bar and the first conductor portion of the second bus bar are spaced apart from each other by a certain distance in the third direction.

2. The current sensor according to claim 1, wherein:
    the first direction is a length direction of the current sensor,
    the second direction is a width direction of the current sensor that is orthogonal to the length direction, and
    the third direction is a height direction of the current sensor that is orthogonal to both the length direction and the width direction.

3. The current sensor according to claim 1, wherein when any one of the plurality of bus bars in which the width of the first conductor portion is greater than the thickness of the first conductor portion is used as a reference bus bar, and the other bus bars arranged on both sides in the first direction with respect to the reference bus bar are used as comparison bus bars, the first conductor portions of two comparison bus bars are arranged on the same side in the second direction with respect to the first conductor portion of the reference bus bar.

4. The current sensor according to claim 3, wherein distances between the first conductor portions of the two comparison bus bars and the first conductor portion of the reference bus bar are the same in the second direction.

5. The current sensor according to claim 1, wherein when viewed from the second direction, the first conductor portion of the first bus bar and the first conductor portion of the second bus bar partially overlap.

6. The current sensor according to claim 5, wherein a part of the first conductor portion of the first bus bar and a part of the first conductor portion of the second bus bar that overlap are the parts near the second conductor portion or third conductor portion in the respective first conductor portions.

7. The current sensor according to claim 1, wherein:
    the at least some of the plurality of bus bars further comprise a fourth conductor portion connected to the second conductor portion and a first connection terminal portion connected to the fourth conductor portion, the first connection terminal portion being connectable to a first external component, and
    the third conductor portion has a second connection terminal portion that is connectable to a second external component.

\* \* \* \* \*